(12) United States Patent
Canaperi et al.

(10) Patent No.: US 9,312,224 B1
(45) Date of Patent: Apr. 12, 2016

(54) INTERCONNECT STRUCTURE CONTAINING A POROUS LOW K INTERCONNECT DIELECTRIC/DIELECTRIC CAP

(71) Applicant: International Business Machines Corporation, Armonk, NY (US)

(72) Inventors: Donald F. Canaperi, Bridgewater, CT (US); Alfred Grill, White Plains, NY (US); Thomas J. Haigh, Claverack, NY (US); Son V. Nguyen, Schenectady, NY (US); Takeshi Nogami, Schenectady, NY (US); Deepika Priyadarshini, Guilderland, NY (US); Hosadurga Shobha, Niskayuna, NY (US); Matthew T. Shoudy, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/567,537

(22) Filed: Dec. 11, 2014

(51) Int. Cl.
  *H01L 23/58* (2006.01)
  *H01L 23/532* (2006.01)
  *H01L 21/768* (2006.01)
  *H01L 21/02* (2006.01)

(52) U.S. Cl.
  CPC ...... *H01L 23/5329* (2013.01); *H01L 21/02126* (2013.01); *H01L 21/02203* (2013.01); *H01L 21/76802* (2013.01); *H01L 21/76843* (2013.01); *H01L 23/53204* (2013.01)

(58) Field of Classification Search
  CPC .................. H01L 21/02126; H01L 21/02203; H01L 21/31695; H01L 23/5329
  USPC .......... 257/632, 635, 758, 750, 751; 438/623, 438/624, 627
  See application file for complete search history.

(56) References Cited

U.S. PATENT DOCUMENTS

| | | | |
|---|---|---|---|
| 6,312,793 B1 | 11/2001 | Grill et al. | |
| 6,316,167 B1 | 11/2001 | Angelopoulos et al. | |
| 7,176,121 B2 | 2/2007 | Ohmori et al. | |
| 7,282,441 B2 * | 10/2007 | Fuller ............... | H01L 21/76807 257/E21.252 |

(Continued)

OTHER PUBLICATIONS

Nguyen, S., et al., "Plasma deposition and development of ultra low k bilayer SiCNx/SiCNy dielectric Cu cap for 32 nm CMOS devices", Electrochemical Society Meeting Abstracts, Oct. 2009, No. 26, p. 2159.

(Continued)

*Primary Examiner* — S. V. Clark
(74) *Attorney, Agent, or Firm* — Scully, Scott, Murphy & Presser, P.C; Steven J. Meyers

(57) ABSTRACT

A porous low k dielectric material containing atoms of at least Si, C, N and H (C and/or O may also be present) is used to provide an interconnect structure having reduced BEOL capacitance and resistance. The porous low k dielectric material is used as an interconnect dielectric material in which at least one interconnect metal-containing structure is embedded therein. The porous low k dielectric material has metal diffusion barrier properties due to the presence of nitrogen as an elemental constituent of the porous low k dielectric material. As such, the porous low k dielectric material can eliminate the need of a diffusion barrier liner, or reduce the thickness of the diffusion barrier liner that is typically formed between an interconnect dielectric material and the embedded interconnect metal structure.

21 Claims, 5 Drawing Sheets

(56) References Cited

U.S. PATENT DOCUMENTS

| | | | |
|---|---|---|---|
| 7,381,659 B2 | 6/2008 | Nguyen et al. | |
| 8,203,210 B2 | 6/2012 | Furusawa et al. | |
| 8,357,608 B2 | 1/2013 | Gates et al. | |
| 8,779,600 B2 | 7/2014 | Nguyen et al. | |
| 2007/0228570 A1* | 10/2007 | Dimitrakopoulos | H01L 21/76825 257/754 |
| 2008/0233366 A1* | 9/2008 | Edelstein | C23C 16/0272 428/201 |
| 2012/0080805 A1 | 4/2012 | Ohto et al. | |
| 2013/0175697 A1 | 7/2013 | Nguyen et al. | |

OTHER PUBLICATIONS

Van Besien et al., "Development and evaluation of a-SiC: H films using a dimethylsilacyclopentane precursor as a low-k Cu capping layer," IEEE International Interconnect Technology Conference (IITC), Jun. 2013, 3 pages, Conference Location: Kyoto.

* cited by examiner

INTERCONNECT STRUCTURE CONTAINING A POROUS LOW K INTERCONNECT DIELECTRIC/DIELECTRIC CAP

BACKGROUND

The present application relates to an interconnect structure for use in semiconductor technology and a method of forming the same. More particularly, the present application relates to an interconnect structure having reduced back-end-of-the-line (BEOL) resistance and capacitance and a method of forming the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure, which may also be referred to as an interconnect structure, typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

Interconnect structures in integrated circuits induce a delay in the propagation of the information between semiconductor devices such as transistors. To reduce this delay, the interconnect structures should possess the lowest capacitance possible.

SUMMARY

A porous low k dielectric material containing atoms of at least Si, N and H (C and/or O can also be present) is used to provide an interconnect structure having reduced BEOL capacitance. The porous low k dielectric material is used as an interconnect dielectric material in which at least one interconnect metal-containing structure is embedded therein. The porous low k dielectric material of the present application has metal diffusion barrier properties due to the presence of nitrogen as an elemental constituent of the porous low k dielectric material. As such, the porous low k dielectric material of the present application can eliminate the need of a diffusion barrier liner or reduce the thickness of the diffusion barrier liner that is typically formed between an interconnect dielectric material and the embedded interconnect metal structure. Such an approach provides an interconnect structure with reduced BEOL resistance.

In one aspect of the present application, an interconnect structure is provided that has reduced BEOL resistant and capacitance. In one embodiment of the present application, the interconnect structure includes a porous low k dielectric material selected from the group consisting of SiCNH, SiCNOH having from greater than 0 atomic % to less than 10 atomic % oxygen, SiNH, SiNOH having from greater than 0 atomic % to less than 10 atomic % oxygen and multilayered stacks thereof. An interconnect metal-containing structure is embedded in the porous low k dielectric material. The interconnect metal-containing structure has a topmost surface that is coplanar with a topmost surface of the porous low k dielectric material. A diffusion barrier cap is located on the topmost surface of the porous low k dielectric material and the topmost surface of the interconnect metal-containing structure.

In another aspect of the present application, a method of forming an interconnect structure having reduced BEOL capacitance is provided. In one embodiment of the present application, the method includes providing a porous low k dielectric material selected from the group consisting of SiCNH, SiCNOH having from greater than 0 atomic % to less than 10 atomic % oxygen, SiNH, SiNOH having from greater than 0 atomic % to less than 10 atomic % oxygen, and multilayered stacks thereof. At least one opening is then formed into the porous low k dielectric material. Next, an interconnect metal-containing structure is formed in the at least one opening. In accordance with the present application, the interconnect metal-containing structure that is formed has a topmost surface that is coplanar with a topmost surface of the porous low k dielectric material. A diffusion barrier cap is then formed on the topmost surface of the porous low k dielectric material and the topmost surface of the interconnect metal-containing structure.

DESCRIPTION

Figure 1:
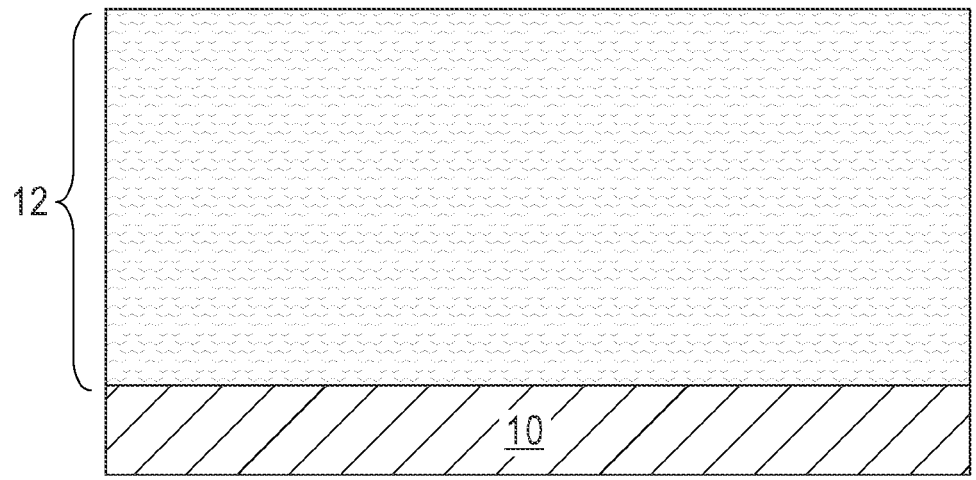
FIG. 1 is a cross sectional view of an exemplary structure including, from bottom to top, a dielectric layer and a porous low k dielectric material that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application provides interconnect structures that have a reduced BEOL resistance and capacitance. The reduced BEOL resistance is achieved by reducing the thickness of, or even eliminating the presence of, a diffusion barrier liner. The reduction of the diffusion barrier liner thickness, or elimination entirely of the diffusion barrier liner, from the interconnect structure increases the cross-section area available for the interconnect metal-containing structure. This, in turn, reduces the resistance of the interconnect metal-containing structure and thus reduces the BEOL RC. RC determines the delay of signals in an interconnect structure and it is the product of the circuit's resistance, R, (typically in ohms) and the circuit's capacitance, C, (typically in Faradays). In the present application, a porous low k dielectric material containing atoms of at least Si, N and H (C and/or O can also be present) is used to provide an interconnect structure having the reduced BEOL RC. The porous low k dielectric material of the present application has metal diffusion barrier properties due to the presence of nitrogen as an elemental constituent of the porous low k dielectric material. It should be noted that nitrogen is typically not desirable to be present in a bulk interconnect dielectric material since such a material has an increased dielectric constant as compared to an equivalent interconnect dielectric material not containing nitrogen. Despite this, the inventors have found that porous low k dielectric materials as described herein and containing nitrogen have metal barrier properties that permit the reduction of the thickness of the diffusion barrier material or even eliminate of the diffusion barrier material entirely from the structure. As such, an interconnect structure containing reduced resistance is obtained in the present application.

Referring first to FIG. 1, there is illustrated an exemplary structure including, from bottom to top, a dielectric layer 10 and a porous low k dielectric material 12 that can be employed in accordance with an embodiment of the present application.

In some embodiments (not shown), the stack of the dielectric layer 10 and the porous low k dielectric material 12 can be formed atop a substrate. The substrate, which is not shown, may comprise a semiconducting material, an insulating material, a conductive material or any combination thereof. When the substrate is comprised of a semiconducting material, any semiconducting material such as Si, SiGe, SiGeC, SiC, Ge alloys, III/V compound semiconductor or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon. When the substrate is an insulating material, the insulating material can be an organic insulator, an inorganic insulator or a combination thereof including multilayers. When the substrate is a conductive material, the substrate may include, for example, polySi, a conductive metal, alloys of at least two conductive metals, a metal silicide, a metal nitride, a carbon nanotube or combinations thereof including multilayers. When the substrate comprises a combination of an insulating material and a conductive material, the substrate may represent a first interconnect level of a multilayered interconnect structure, and the material stack (10/12) shown in FIG. 1, may provide components of a second interconnect level of the multilayered interconnect structure.

As shown, the dielectric layer 10 has a topmost surface that forms an interface with a bottommost surface of the porous low k dielectric material 12. In some embodiment of the present application, the dielectric layer 10 may comprise a same dielectric material as the porous low k dielectric material 12. In other embodiments of the present application, the dielectric layer 10 may comprise a different dielectric material as the porous low k dielectric material 12. The dielectric layer 10 may comprise a single dielectric material or the dielectric layer 10 may comprise two or more dielectric materials stacked one atop the other. In some embodiments, the dielectric layer 10 may be a dense, i.e., non-porous, dielectric material. In other embodiments, the dielectric layer 10 may be a porous dielectric material. Examples of dielectric materials that can provide the dielectric layer 10 include, but not limited to, SiCNH, silicon nitride, silicon oxynitride and multilayered combinations thereof. In one embodiment of the present application, dielectric layer 10 is composed entirely of non-porous, i.e., dense, SiCNH. The thickness of the dielectric layer 10 can be from 8 nm to 100 nm, although thicknesses lesser than or greater than the aforementioned thickness range may also be employed in the present application.

The dielectric layer 10 can be formed utilizing a deposition process such as, for example, chemical vapor deposition, plasma enhanced chemical vapor deposition, evaporation or chemical solution deposition. In some embodiments of the present application, dielectric layer 10 can be formed by a thermal process such as, for example, nitridation or a combination of oxidation and nitridation. In some embodiments, and when the dielectric layer 10 includes a multilayered stack, any combination of the above mentioned techniques (i.e., deposition and/or thermal processing) can be used to provide the dielectric layer 10.

In some embodiments of the present application, and following the deposition process, a curing step may be performed. The curing step, which may be employed, serves to toughen or harden the dielectric material that provides the dielectric layer 10 by cross-linking of polymer chains. The crosslinking may be achieved by electron beams, ultra-violet (UV) radiation, heat or chemical additives. Curing may be performed by a thermal cure, an electron beam cure, an ultra-violet (UV) cure, an ion beam cure, a plasma cure, a microwave cure, an additive cure or any combination thereof. The conditions for each of the curing processes, as well as curing additives, are well known to those skilled in the art.

After providing the dielectric layer 10, the porous low k dielectric material 12 is formed directly on the topmost surface of the dielectric layer 10; there is no graded dielectric region required to be present between dielectric layer 10 and the porous low k dielectric material 12. In prior art interconnect structures in which a porous SiCOH dielectric material is employed as an interconnect dielectric material, a graded dielectric layer is required to be present between the porous SiCOH dielectric material and the underlying dielectric layer. The porous low k dielectric material 12 is a contiguous layer that covers an entirety of the dielectric layer 10. As previously stated, the porous low k dielectric material 12 comprises a dielectric material that contains containing atoms of at least Si (silicon), N (nitrogen) and H (hydrogen). In some embodiments, the dielectric material that provides the porous low k dielectric material 12 may also include C (carbon). In yet other embodiments, the dielectric material that provides the porous low k dielectric material 12 may also include O (oxygen), with or without C. In accordance with the present application, the porous low k dielectric material 12 includes SiCNH, SiCNOH, SiNH, SiNOH or multilayered stacks thereof; when oxygen is present that amount of oxygen is within the range indicated herein below.

In one embodiment of the present application, the amount of silicon that is present in the porous low k dielectric material 12 is from 20 atomic % to 50 atomic % silicon, the amount of nitrogen that is present in the porous low k dielectric material 12 is from 5 atomic % to 40 atomic % nitrogen, and the amount of hydrogen that is present in the porous low k dielectric material 12 is from 1 atomic % to 30 atomic % hydrogen. When carbon is present in the porous low k dielectric material 12, the carbon is present in an amount from 15 atomic % to 50 atomic % carbon. When oxygen is present in the porous low k dielectric material 12, the amount of oxygen is greater than 0 atomic % to less than 10 atomic % oxygen. Although an oxygen content up to 10 atomic % oxygen can be used, it is desirable to have a porous low k dielectric material 12 that has an oxygen content of less than 5 atomic % oxygen, preferably less than 3 atomic % oxygen, and more preferably 0 atomic % oxygen, since such materials (e.g., SiCNH and/or SiNH) are more stable than porous low k dielectric materials having a higher oxygen content. Also, it was been determined that when the concentration of oxygen is above 10 atomic %, the dielectric material tends to react more with the diffusion barrier liner. Such a reaction may adversely impact the diffusion barrier property of the diffusion barrier liner.

The porous low k dielectric material 12 of the present application has a dielectric constant that is from 2.0 to 3.5, a measured porosity from 1% up to and including 25%, and a modulus, as measured by nano-indentation, of from 7 GPa to 150 GPa. The thickness of the porous low k dielectric material 12 can be from 30 nm to 500 nm, although thicknesses that are lesser than or greater than the aforementioned thickness range may also be employed in the present application. In some embodiments of the present application, the adhesion strength between the dielectric layer 10 and the porous low k dielectric material 12, as measured in a 4-point bend adhesion test, is greater than 3.5 Joule/meter$^2$.

The porous low k dielectric material 12 can be formed utilizing a deposition process including, for example, chemical vapor deposition (CVD) or plasma enhanced chemical vapor deposition (PECVD). In some embodiments of the present application, the dielectric layer 10 and the porous low k dielectric material 12 can be deposited sequentially in a same reactor chamber and without breaking vacuum between the various deposition steps. The deposition of the porous low k dielectric material 12 includes the use of various source gases including a carbon source gas, a silicon source gas, and a nitrogen source gas. In some embodiments of the present application, the porous low k dielectric material 12 can be deposited utilizing a combined carbon/silicon source gas. In other embodiments of the present application, no carbon source gas is used in providing the porous low k dielectric material 12. In some embodiments, a nitrogen-oxygen source gas can also be used. Examples of carbon source gases that can be used in forming the porous low k dielectric material 12 include, but are not limited to, hydrocarbons such alkenes and alkynes. Examples of hydrocarbons that can be employed include, but are not limited to, methane, ethane, ethylene, butane, and butadiene. Examples of silicon source gases that can be used in forming the porous low k dielectric material 12 include, but are not limited to, silanes, disilanes, and trisilane. Examples of combined carbon/silicon source gas the porous low k dielectric material 12 include, but are not limited to, carbosilanes, cyclic silazanes, dimethyl silacyclopentane, trimethyl silane, and tetramethyl silane. Examples of nitrogen source gases that can be used in forming the porous low k dielectric material 12 include, but are not limited to, ammonia ($NH_3$), and $N_2$. Examples of nitrogen-oxygen source gases that can be used include, but are not limited to, $N_2O$, and a mixture of $N_2$ and $O_2$. In some embodiments of the present application in which the dielectric layer 10 includes a same material as the porous low k dielectric material 12, similar reactant precursors can be used in forming both materials.

In some embodiments of the present application, the deposition of the porous low k dielectric material 12 by PECVD can be performed in a PECVD reactor, such as for example, a 300 mm PECVD tool. In some embodiments, the PECVD of the porous low k dielectric material 12 can be performed at a pressure ranging from 0.1 torr to 100 torr. In one example, the deposition of the porous low k dielectric material 12 by PECVD can be performed at a pressure ranging from 3 torr to 10 torr. In one embodiment of the present application, the wafer chuck temperature during the deposition of the porous low k dielectric material 12 can range from 100° C. to 450° C. In one example, the wafer chuck temperature during the deposition of the porous low k dielectric material 12 can be from 300° C. to 350° C.

Conventional porogens such as, for example, ethylene, or bicycloheptadiene (BCHD) porogen precursors or other hydrocarbon precursors, as are well known to those skilled in the art can be introduced in the dielectric film during the deposition process. The porogens aid in increasing the carbon content and the porosity of the porous low k dielectric material 12. In some cases, a separate porogen is not used in providing the porous low k dielectric material 12. In such instances, a source gas/liquid containing a built-in porogen can be used in providing the porous low k dielectric material 12. One example of such a source gas is dimethylsilacyclopentane (DMSCP). In some embodiments of the present application, and following the deposition of the dielectric material that provides the porous low k dielectric material 12, a curing step, as described above, can be performed.

In one embodiment of the present application, the porous low k dielectric material 12 is provided by depositing a film of the porous low k dielectric material 12 by plasma enhanced chemical vapor deposition using a carbosilane precursor and a nitrogen-containing precursor, and thereafter curing the film. In such an embodiment, the depositing may be performed in the presence of a nitrogen-oxygen source.

In another embodiment of the present application, the porous low k dielectric material 12 is provided by depositing a film of the porous low k dielectric material 12 by plasma enhanced chemical vapor deposition using a carbosilane precursor and a carbosilane amine based precursor, and thereafter curing the film. In such an embodiment, the depositing can be performed in the presence of a nitrogen-oxygen source.

In one example, the porous low k dielectric material 12 can be deposited by PECVD using either trimethylsilane (TMS) or dimethylsilacyclopentane (DMSCP) in conjunction with an ammonia ($NH_3$) or nitrogen ($N_2$) gas reactant at a temperature in the range of from 100° C. to 400° C., preferably in a range from 250° C. to 350° C. using 13.56 MHz RF frequencies.

In one embodiment in which the dielectric layer 10 comprises SiCNH and the porous low k dielectric material 12 comprises SiCNH, a sequential PECVD process is performed in which the dielectric layer 10 is deposited with a high flow rate (>5:1 molar ratio) of $NH_3$/TMS or $NH_3$/DMSCP. The porous low k dielectric material 12 is thereafter deposited with a low flow rate (<5:1 molar ratio) of $NH_3$/TMS or $NH_3$/DMSCP by ramping down quickly the $NH_3$ flow. Curing may be used if the porous low k dielectric material 12 is deposited at a low temperature in a range from 200° C. to 300° C. In such an embodiment, the dielectric layer 10 can be generally a nitrogen-rich silicon carbon nitride film deposited with high $NH_3$/TMS or $NH_3$/DMSCP ratios preferably at about 350° C. Further, and in such an embodiment, the dielectric layer 10 has more Si—N bonding (N>=14 atomic %) in order for the layer to remain a good barrier to oxygen and conductive metal, i.e., copper, diffusion. In the illustrated embodiment, the porous low k dielectric material 12 can be generally deposited with a low $NH_3$/TMS or $NH_3$/DMSCP ratio and is a carbon-rich silicon carbon nitride containing more carbon (>=33 atomic %) and low nitrogen (<=4 atomic %). In such an embodiment, the porous low k dielectric material 12 can be deposited at about 250° C. and then cured.

Figure 2:
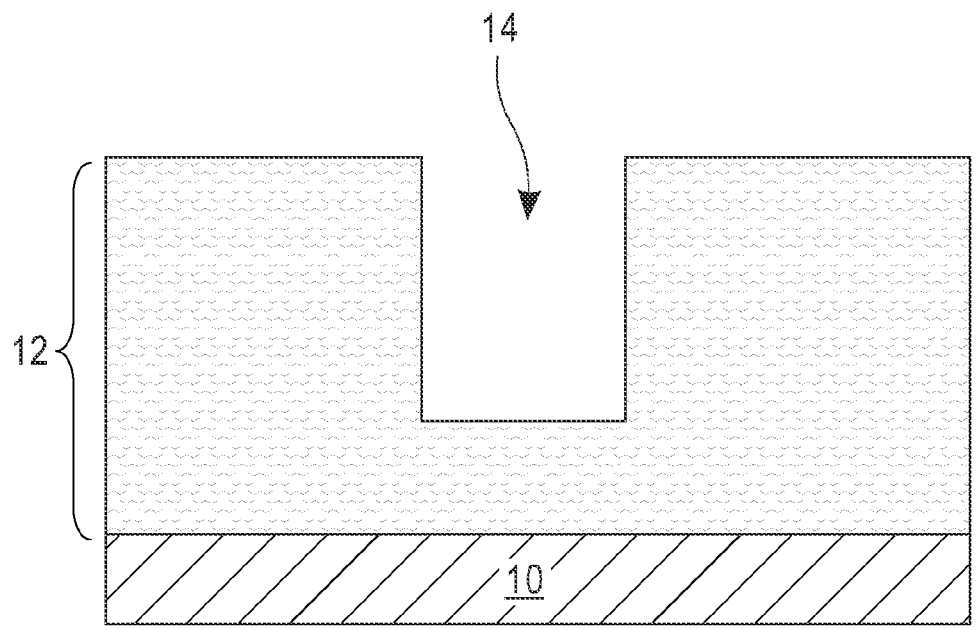
FIG. 2 is a cross sectional view of the exemplary structure of FIG. 1 after forming an opening into the porous low k dielectric material.

Referring now to FIG. 2, there is illustrated the exemplary structure of FIG. 1 after forming an opening 14 into the porous low k dielectric material 12. Although a single opening is described and illustrated in the present application, a plurality of openings can be formed into the porous low k dielectric material.

The at least one opening 14 that is formed into the porous low k dielectric material 12 can be a via opening, a line opening, a combined via and line opening or any combination thereof. For example, a first set of openings can be via openings, while a second set of opening can be combined via and line openings. When a combined via and line opening is formed, the via opening and line opening are in direct communication with each.

In some embodiments, the at least one opening 14 can extend partially through the porous low k dielectric material 12. In other embodiments, the at least one opening 14 can extend entirely through the porous low k dielectric material 12. In yet further embodiments, a first set of openings can extend partially through the porous low k dielectric material 12, while a second set of openings can extend entirely through the porous low k dielectric material 12. In embodiments in which the openings extend entirely through the porous low k dielectric material 12, the bottom of the openings stops on a topmost surface of dielectric layer 10.

The at least one opening 14 that is provided into the porous low k dielectric material 12 can be formed utilizing lithography and etching. The lithographic process includes forming a photoresist (not shown) atop the porous low k dielectric material 12, exposing the photoresist to a desired pattern of radiation and developing the exposed photoresist utilizing a conventional resist developer. In some embodiments, a hard mask such as, for example, a layer of silicon oxide and/or silicon nitride, can be interposed between the photoresist and the porous low k dielectric material 12. The etching process includes a dry etching process (such as, for example, reactive ion etching, ion beam etching, plasma etching or laser ablation), and/or a wet chemical etching process. Typically, reactive ion etching is used in providing the at least one opening into the porous low k dielectric material 12. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying the porous low k dielectric material 12. After transferring the pattern into the porous low k dielectric material 12, the remaining hard mask material can be removed from atop the porous low k dielectric material 12 by etching or planarization. In some embodiments, the remaining hard mask may be left atop the porous low k dielectric material 12 containing the opening 14 and be removed during the formation of the diffusion barrier liner and the interconnect metal-containing structure.

In one embodiment, and when a combined via and line opening is formed, a via opening can be formed first and then a line opening is formed atop and in communication with the via opening. In another embodiment, and when a combined via and line opening is formed, a line opening can be formed first and then a via opening is formed atop and in communication with the line opening. When a via or line is formed, a single damascene process (including the above mentioned lithography and etching steps) can be employed. When a combined via and line opening is formed a dual damascene process (including at least one iteration of the above mentioned lithography and etching steps) can be employed.

At this point of the present application, the at least one opening 14 exposes at least the sidewall surfaces of the porous low k dielectric material 12. In embodiments in which the opening does not extend completely through the porous low k dielectric material 12, the opening 14 exposes a sub-surface of the porous low k dielectric material 12. By "sub-surface" it is meant a surface of a material that is located beneath an original topmost surface of the material. In embodiments in which the opening 14 extends completely through the porous low k dielectric material 12, and as mentioned above, a topmost surface of the dielectric layer 10 is exposed.

In some embodiments of the present application (not shown) and during the formation of the opening 14, an upper portion of the porous low k dielectric material 12 can be damaged. The damaged upper portion of the porous low k dielectric material 12 has different physical and/or chemical properties as compared to the remaining undamaged portions of the porous low k dielectric material 12. The damaged upper portion of the porous low k dielectric material 12 can extend to a depth of from 50 nm below the topmost surface of the porous low k dielectric material. Because of the presence of nitrogen within the porous low k dielectric material 12, this damaged region is much thinner than damaged regions formed into a conventional SiCOH dielectric material. In some embodiments of the present application, the damaged upper portion of the porous low k dielectric material 12 may have a lower C content than the remaining non-damaged portion of the porous low k dielectric material 12.

Figure 3:
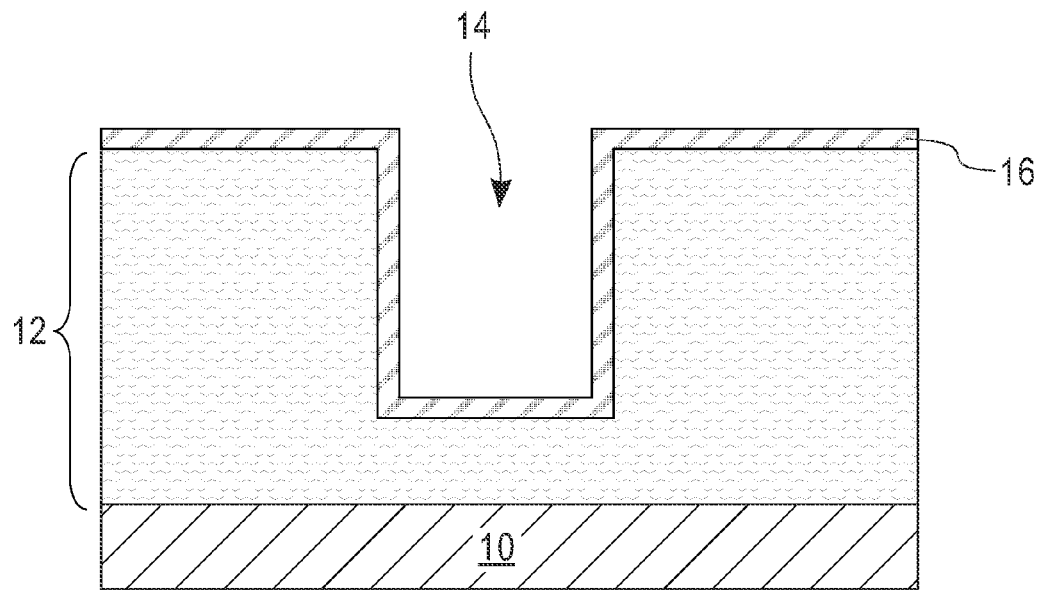
FIG. 3 is a cross sectional view of the exemplary structure of FIG. 2 after forming a diffusion barrier liner material.

Referring now to FIG. 3, there is illustrated the exemplary structure of FIG. 2 after forming a diffusion barrier liner material 16. As is shown, the diffusion barrier liner material 16 is a contiguous material that is formed on all exposed surfaces of the porous low k dielectric material 12. In the illustrated embodiment, the diffusion barrier liner material 16 is located on a topmost surface of the porous low k dielectric material 12 outside the opening 14, and on the sidewall surfaces and sub-surface of the porous low k dielectric material 12 inside the opening 14.

The terms "contiguously" or "contiguous" denotes that a particular layer such as, for example, diffusion barrier liner material 16, does not include any breaks therein. The diffusion barrier liner material 16 does not completely fill the opening 14, but rather the diffusion barrier liner material 16 is present along the sidewall surfaces of and, if present, the sub-surface of the porous low k dielectric material 12.

The diffusion barrier liner material 16 can include Co, CoN, CoW, Mo, Mn, Ni, Ir, Pt, Pd, Ta, TaN, Ti, TiN, Ru, RuN, TaRu, TaNRu, Mn, MnN, W, WN, any combination thereof or any other material that can serve as a barrier to prevent a conductive metal or metal alloy from diffusing there through. Because of the presence of nitrogen within the porous low k dielectric material 12, the thickness of the diffusion barrier liner material 16 can be made much thinner than a same diffusion barrier liner material formed on a non-nitrogen containing porous low k dielectric material such as, for example, a silicon oxycarbide, or SiCOH. In one embodiment of the present application, the diffusion barrier liner material 16 has a thickness of greater than 0 nm to 6 nm. In another embodiment of the present application, the diffusion barrier liner material 16 has a thickness of less than or equal to 2.5 nm. In some embodiments, see, for example, the embodiment shown in FIGS. 9-10, the diffusion barrier liner material 16 can be omitted.

The diffusion barrier liner material 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
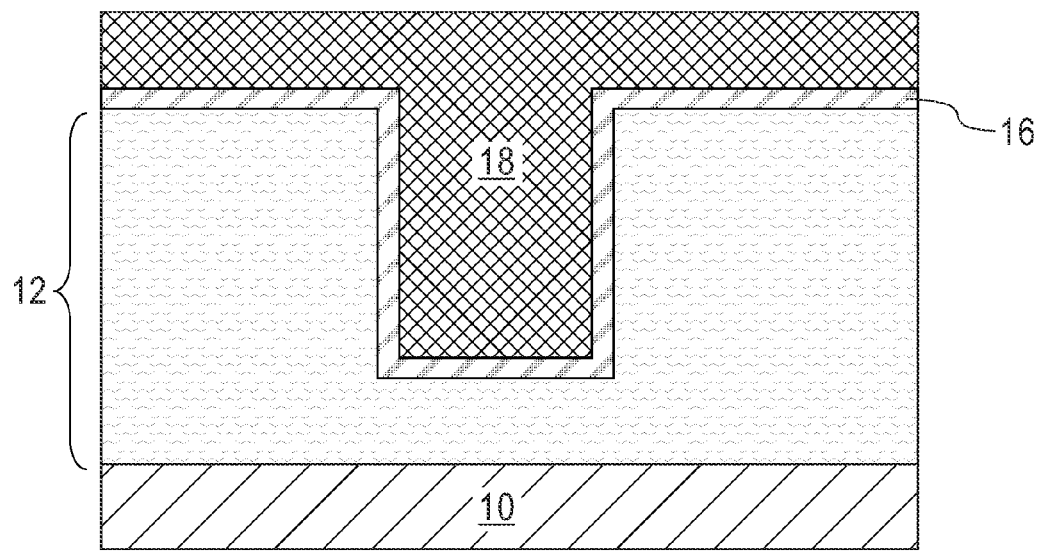
FIG. 4 is a cross sectional view of the exemplary structure of FIG. 3 after forming a conductive metal-containing material on the diffusion barrier liner material.

Referring now to FIG. 4, there is illustrated the exemplary structure of FIG. 3 after forming a conductive metal-containing material 18 on the diffusion barrier liner material 16. The conductive metal-containing material 18 is a contiguous layer and, as is shown, it completely fills a remaining volume of the opening 14. The conductive metal-containing material 18 is thus present inside and outside of the opening 14. The conductive metal-containing material 18 may include a conductive metal, a conductive metal alloy, a conductive metal nitride or any combination thereof. Examples of conductive metal-containing materials 18 that can be employed in the present application include, but are not limited to, Cu, W, Al, AlCu, and CuMn. The conductive metal-containing material 18 may be formed by a deposition process including chemical vapor deposition (CVD), plasma enhanced chemical vapor deposition (PECVD), sputtering, chemical solution deposition or plating that fills the at least one opening 14 from the bottom upwards. In one embodiment, a bottom-up plating process is employed in forming the conductive metal-containing material 18.

Figure 5:
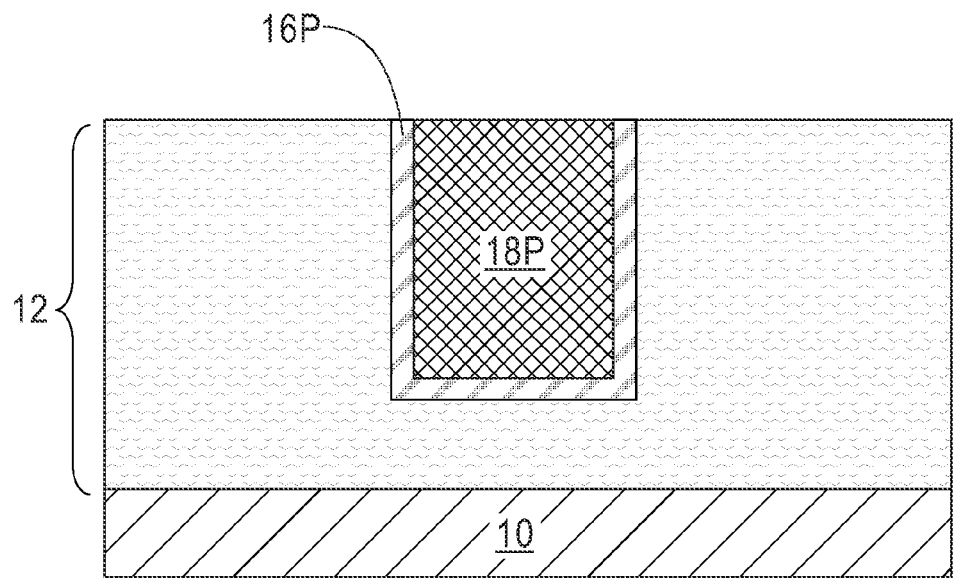
FIG. 5 is a cross sectional view of the exemplary structure of FIG. 4 after removing the diffusion barrier liner material and the conductive metal-containing material that are located outside the opening, while maintaining the diffusion barrier liner material and the conductive metal-containing material inside the opening.

Referring now to FIG. 5, there is illustrated the exemplary structure of FIG. 4 after removing the diffusion barrier liner material 16 and the conductive metal-containing material 18 that are located outside the opening 14, while maintaining the diffusion barrier liner material 16 and the conductive metal-containing material 18 inside the opening 14. The maintained diffusion barrier liner material 16 is referred to herein as diffusion barrier liner 16P, and the maintained conductive metal-containing material 18 is referred to herein as an interconnect metal-containing structure 18P. As is shown, a topmost surface of the diffusion barrier liner 16P and a topmost surface of the interconnect metal-containing structure 18P are coplanar with each as well as being coplanar with a topmost surface of the porous low k dielectric material 12. A planarization process such as, for example, chemical mechanical polishing (CMP) and/or grinding, can be used to remove all material that is present outside the at least one opening 14 forming the structure shown in FIG. 5.

Figure 6:
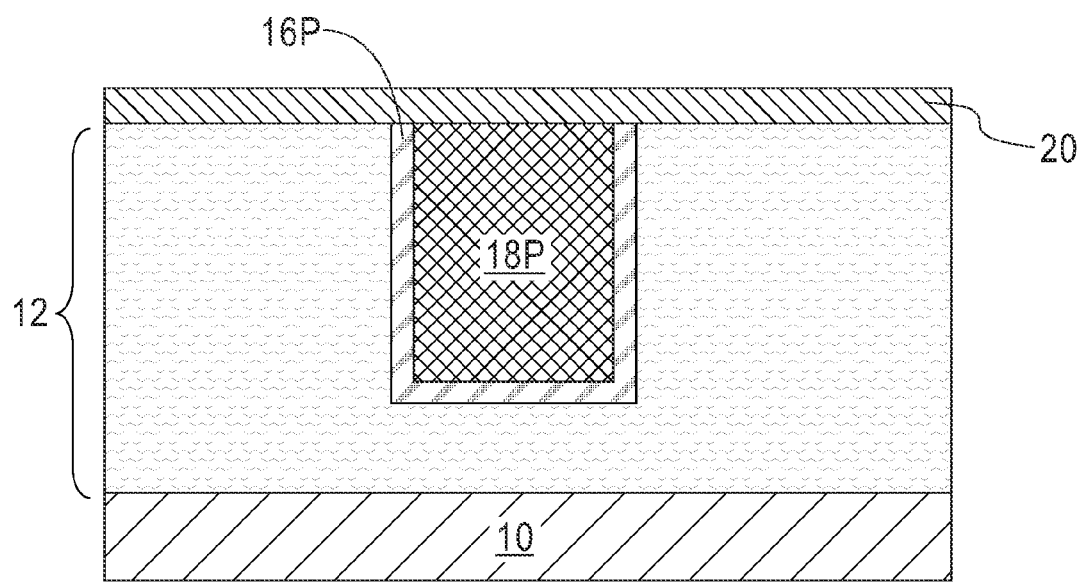
FIG. 6 is a cross sectional view of the exemplary structure of FIG. 5 after forming a diffusion barrier cap on topmost surfaces of the diffusion barrier liner material and the conductive metal-containing material that remains in the opening as well as a topmost surface of the porous low k dielectric material.

Referring now to FIG. 6, there is illustrated the exemplary structure of FIG. 5 after forming a diffusion barrier cap 20 on topmost surfaces of the diffusion barrier liner 16P and the interconnect metal-containing structure 18P as well as a topmost surface of the porous low k dielectric material 12. In some embodiments in which a damaged region is formed into the upper portion of the porous low k dielectric material 12, the diffusion barrier cap 20 is formed directly on a topmost surface of the damaged portions of the dielectric material.

In one embodiment of the present application, the diffusion barrier cap 20 may comprise a same dielectric material as the porous low k dielectric material 12. In another embodiment of the present application, the diffusion barrier cap 20 may comprise a different dielectric material as that of the porous low k dielectric material 12. The diffusion barrier cap 20 may comprise a single dielectric material or the diffusion barrier cap 20 may comprise two or more dielectric materials stacked one atop the other. In some embodiments, the diffusion barrier cap 20 may be a dense, i.e., non-porous, dielectric material. In other embodiments, the diffusion barrier cap 20 may be a porous dielectric material. Examples of dielectric materials that can provide the diffusion barrier cap 20 include, but not limited to, SiCNH, silicon nitride, silicon oxynitride and multilayered combinations thereof. In one embodiment of the present application, diffusion barrier cap 20 is composed entirely of non-porous SiCNH. In some embodiments of the present application, the diffusion barrier cap 20 can be formed utilizing reactants as described above in forming the porous low k dielectric material 12 in conjunction with a selective Co metal cap.

The thickness of the diffusion barrier cap 20 can be from 8 nm to 100 nm, although thicknesses that are lesser than or greater than the aforementioned thickness range may also be employed in the present application. In some embodiments of the present application, the adhesion strength between the diffusion barrier cap 20 and the porous low k dielectric material 12, as measured in a 4-point bend adhesion test, is greater than 3.5 Joule/meter$^2$.

The diffusion barrier cap 20 can be formed utilizing one of processes mentioned above in forming the dielectric layer 10. A curing step may follow the deposition of the dielectric material that provides the diffusion barrier cap 20. In some embodiments of the present application, the diffusion barrier cap 20 can be formed in a same reactor chamber as that used to provide the porous low k dielectric material 12.

Figure 7:
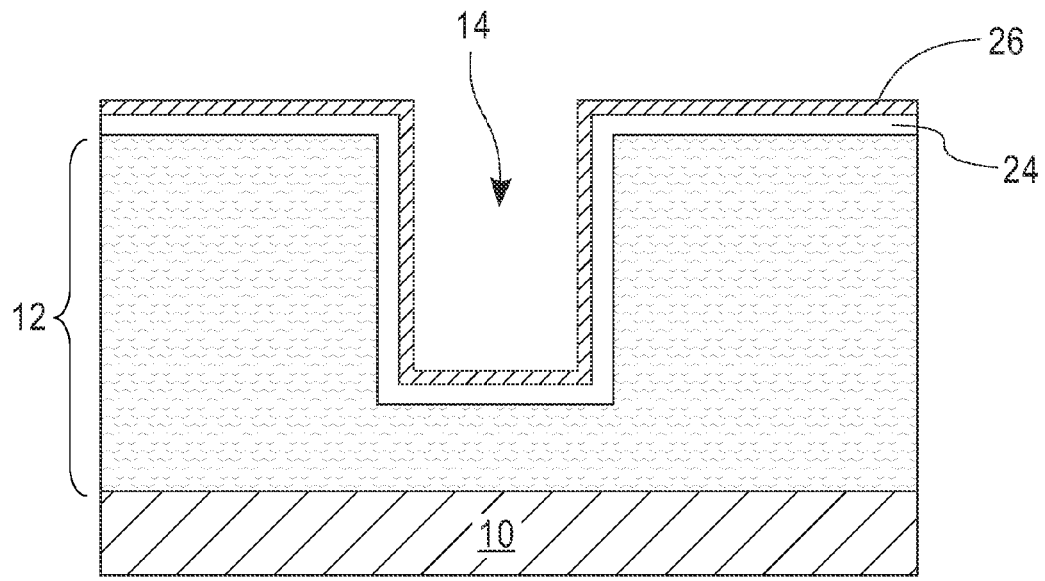
FIG. 7 is a cross sectional view of the exemplary structure of FIG. 2 after forming a material stack comprising, from bottom to top, a conductive layer and a plating seed layer.

Referring now to FIG. 7, there is illustrated the exemplary structure of FIG. 2 after forming a material stack (24, 26) comprising, from bottom to top, a conductive layer 24 and a plating seed layer 26. As is shown, the material stack (24, 26) is formed on exposed surfaces of the porous low k dielectric material 12 that are located outside and inside of the at least one opening 14. The material stack (24, 26) is a contiguous layer that is present on the entirety of the exposed surfaces of the porous low k dielectric material 12. The material stack (24, 26) is used to provide a self-forming diffusion barrier liner (to be defined herein below).

The material stack is formed by first providing conductive layer 24 within the opening 14. The conductive layer 24 may comprise a metal selected from Co, Ru, W, Ta, Mo, Ti, Mn, nitrides of the aforementioned metals, and a combination of a metal and a metal nitride. In one example, Co or Ru is used as the conductive layer 24 together with TaN or Ta to form TaN/Co or TaN/Ru or Ta/Co or Ta/Ru conductive layer 24. In some embodiments of the present application and when Ta is in contact with porous SiCNH or porous SiNH, it may react with nitrogen in the porous dielectric film to form a $TaN_x$ layer which may have lower resistance than TaN. The conductive layer 24 can be formed by a deposition process including those mentioned above in forming the diffusion barrier liner material 16. The thickness of the conductive layer 24 can be within the range mentioned above for the diffusion barrier liner material 16.

Next, a plating seed layer 26 is formed on the surface of the conductive layer 24. The plating seed layer 26 may include Mn, Cu, Ru, Jr or any other plating seed material. In one embodiment, Mn is used as the plating seed layer 26. The plating seed layer 26 can be formed by deposition including one of the deposition processes used in forming the diffusion barrier liner material 16. In one embodiment, the thickness of the plating seed layer 26 is from 0.1 nm to 15 nm. In one example, the thickness of the plating seed layer 26 is from 0.3 nm to 2.5 nm.

Figure 8:
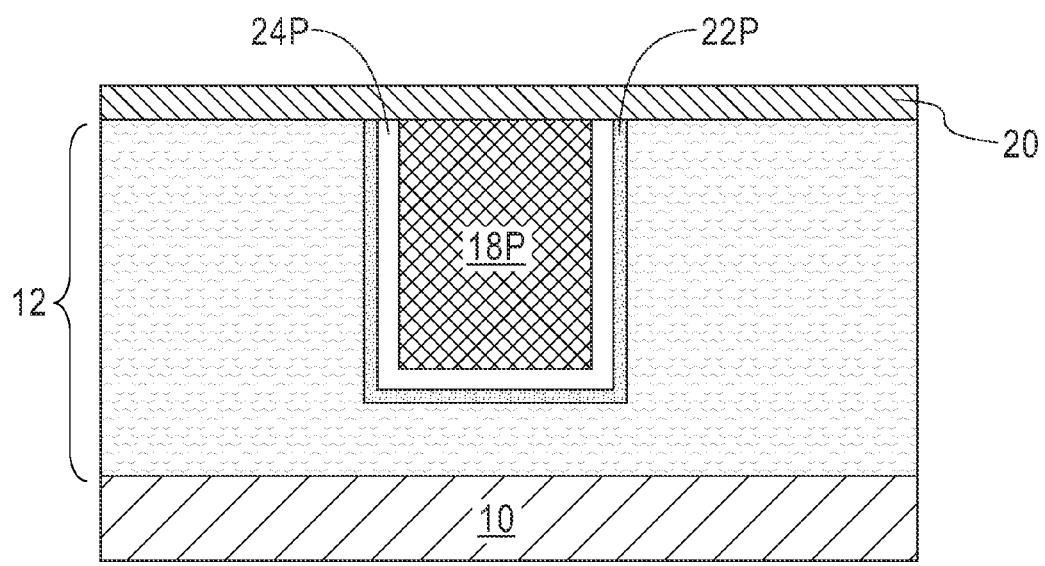
FIG. 8 is a cross sectional view of the exemplary structure of FIG. 7 after forming a conductive metal-containing material, removing the material stack and the conductive metal-containing material that are located outside the opening, while maintaining the material stack and the conductive metal-containing material inside the opening, performing an anneal that forms a self-forming diffusion barrier liner and forming a diffusion barrier cap on topmost surfaces of the self-forming diffusion barrier liner and the conductive metal-containing material that remains in the opening as well as a topmost surface of the porous low k dielectric material.

Referring now to FIG. 8, there is illustrated the exemplary structure of FIG. 7 after forming a conductive metal-containing material, removing the material stack (24, 26) and the conductive metal-containing material that are located outside the opening 14, while maintaining the material stack and the conductive metal-containing inside the opening, performing an anneal that converts the material stack (24, 26) into a self-forming diffusion barrier liner 22P and forming a diffusion barrier cap 20 on topmost surfaces of the self-forming diffusion barrier liner 22P and the conductive metal-containing material that remains in the opening as well as a topmost surface of the porous low k dielectric material.

The conductive metal-containing material used in this embodiment of the present application is the same as those described above in providing the conductive metal-containing material 18 to the structure shown in FIG. 4. The removal of the various materials that are located outside of the opening and above the topmost surface of the porous low k dielectric material can be performed utilizing a planarization process as described above in forming the structure shown in FIG. 5. The diffusion barrier cap 20 can include one of the materials mentioned above and can be formed utilizing one the techniques mentioned above.

Although the anneal that converts material stack (24, 26) into the self-forming diffusion barrier liner 22P is described as being performed prior to forming the diffusion barrier cap 20, it is also possible to perform the anneal after forming the diffusion barrier cap 20. The self-forming diffusion barrier liner 22P includes a $MN_xSiC_y$ layer. In some embodiments, self-forming diffusion barrier liner 22P could be intermixed with other materials from conductive layer 24 such as, for example, Ta and Mo. The term "self-forming diffusion barrier liner" denotes a material that is resistant to conductive metal, i.e., copper, diffusion, which includes a $MN_xSiC_y$ layer, wherein M is Mn, Cu, Ru, Jr or any other plating seed layer, x is from 0.05 to 1, y is from 0.1 to 1, and the remaining metal layer comprises a metal selected from Co, Ru, W, Ta and Ti and the associated metal nitrides.

The self-forming diffusion barrier liner 22P forms by diffusing metal from the plating layer 26 through the conductive layer 24 and into a portion of the porous low k dielectric material 12 wherein it reacts with the porous low k dielectric material 12 to provide the self-forming diffusion barrier liner 22P: the plating seed layer 26 does not exist after the anneal. Typically, M of the $MN_xSiC_y$ layer that provides the self-forming diffusion barrier liner 22P is Mn. The diffusion of metal from the plating seed layer 26 and the above mentioned reaction occurs by annealing. The anneal can be performed in an inert ambient such as He, Ar, Ne, and/or $N_2$ and at a temperature from 200° C. to 400° C. The anneal may be performed by a furnace anneal or a rapid thermal anneal.

Figure 9:
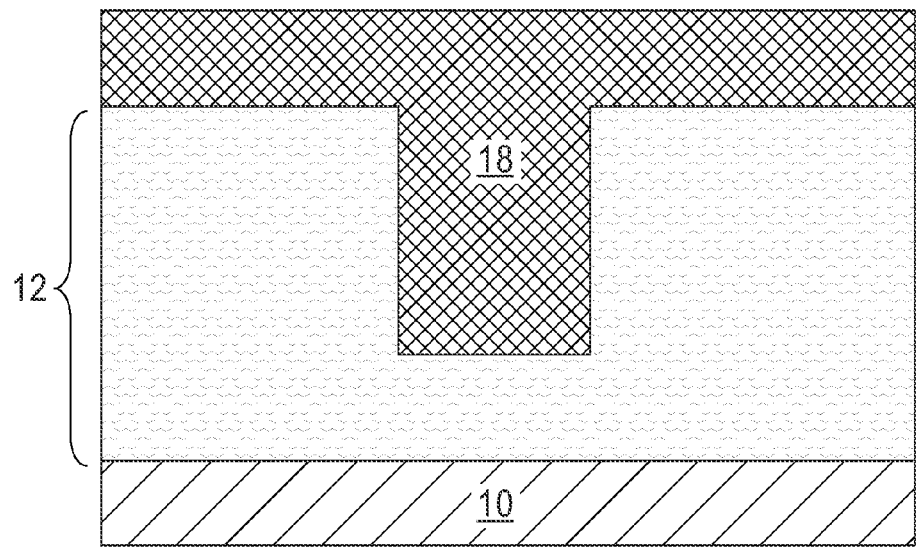
FIG. 9 is a cross sectional view of the exemplary structure of FIG. 2 after forming a conductive metal-containing material directly on exposed surfaces of the porous low k dielectric material in accordance with a further embodiment of the present application.

Referring now to FIG. 9, there is illustrated the exemplary structure of FIG. 2 after forming a conductive metal-containing material 18 directly on exposed surfaces of the porous low k dielectric material 12 in accordance with a further embodiment of the present application. The conductive metal-containing material 18 can include one of the conductive metals, metal alloys or metal nitride mentioned above in providing the structure shown in FIG. 4 of the present application. Also, one of the deposition processes mentioned above in providing the conductive metal-containing material 18 shown in FIG. 4 can also be used in this embodiment of the present application.

Figure 10:
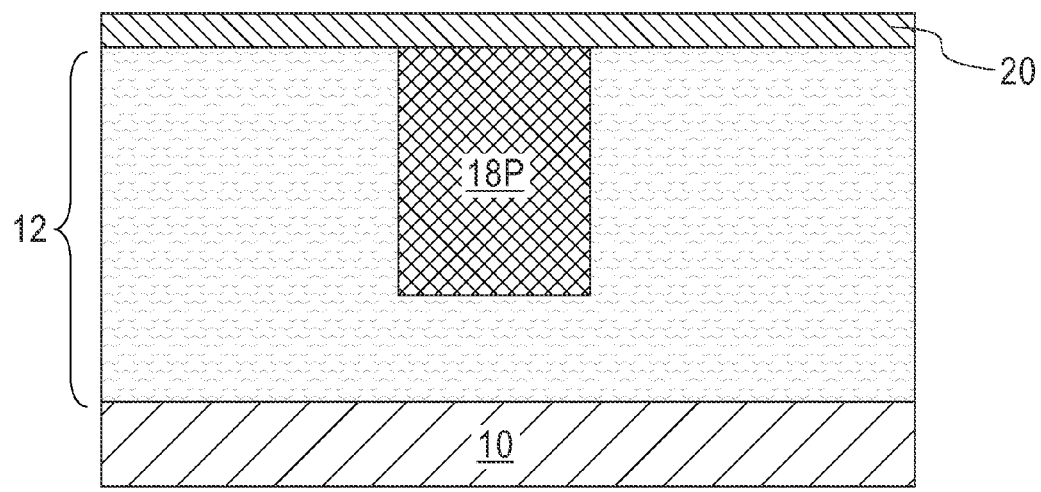
FIG. 10 is a cross sectional view of the exemplary structure of FIG. 9 after removing the conductive metal-containing material that is located outside the opening, while maintaining the conductive metal-containing material inside the opening, and forming a diffusion barrier cap on a topmost surface of the conductive metal-containing material that remains in the opening as well as a topmost surface of the porous low k dielectric material.

Referring now to FIG. 10, there is illustrated the exemplary structure of FIG. 9 after removing the conductive metal-containing material 18 that is located outside the opening 14, while maintaining the conductive metal-containing material (as interconnect metal-containing structure 18P) inside the opening 14, and forming a diffusion barrier cap 20 on a topmost surface of the conductive metal-containing material (i.e., the interconnect metal-containing structure 18P) that remains in the opening 14 as well as a topmost surface of the porous low k dielectric material 12. The structure shown in FIG. 10 can be formed utilizing the materials and the processing steps as described above in providing the structure shown in FIGS. 5-6 of the present application.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
   a porous low k dielectric material selected from the group consisting of SiCNH, SiCNOH having from greater than 0 atomic % to less than 10 atomic % oxygen, SiNH, SiNOH having from greater than 0 atomic % to less than 10 atomic % oxygen and multilayered stacks thereof;
   an interconnect metal-containing structure embedded in the porous low k dielectric material, wherein said interconnect metal-containing structure has a topmost surface that is coplanar with a topmost surface of said porous low k dielectric material; and
   a diffusion barrier cap located on said topmost surface of said porous low k dielectric material and said topmost surface of said interconnect metal-containing structure.

2. The interconnect structure of claim 1, wherein a diffusion barrier liner is present between said interconnect metal-containing structure and said porous low k dielectric material.

3. The interconnect structure of claim 2, wherein said diffusion barrier liner has a thickness from greater than 0 nm to less or equal to 6 nm.

4. The interconnect structure of claim 3, wherein said diffusion barrier liner comprises a material selected from the group consisting of Co, CoN, CoW, Mo, Mn, Ni, Ir, Pt, Pd, Ta, TaN, Ti, TiN, Ru, RuN, TaRu, TaRu, TaNRu, Mn, MnN, W, WN and multilayered combinations thereof.

5. The interconnect structure of claim 2, wherein said diffusion barrier liner comprises a stack of, from bottom to top, a $MN_xSiC_y$ layer and a conductive layer, wherein M is a plating seed metal, x is from 0.05 to 1, y is from 0.1 to 1, and said conductive layer comprises a metal selected from Co, Ru, Ni, W, Ta and Ti and associated metal nitrides.

6. The interconnect structure of claim 5, wherein M is Mn.

7. The interconnect structure of claim 1, wherein said diffusion barrier cap is selected from SiCNH, silicon nitride, silicon oxynitride and multilayered combinations thereof.

8. The interconnect structure of claim 1, wherein said interconnect metal-containing structure has sidewall surfaces and a bottommost surface that directly contact said porous low k dielectric material.

9. The interconnect structure of claim 1, further comprising a dielectric layer located beneath said porous low k dielectric material, said dielectric layer is selected from SiCNH, silicon nitride, silicon oxynitride and multilayered combinations thereof.

10. The interconnect structure of claim 1, wherein said porous low k dielectric material is SiCNH, and said diffusion barrier cap is non-porous SiCNH.

11. The interconnect structure of claim 10, wherein a diffusion barrier liner is present between said interconnect metal-containing structure and said porous low k dielectric material.

12. The interconnect structure of claim 10, wherein said interconnect metal-containing structure has sidewall surfaces and a bottommost surface that directly contact said porous low k dielectric material.

13. A method of forming an interconnect structure, said method comprising:
providing a porous low k dielectric material selected from the group consisting of SiCNH, SiCNOH having from greater than 0 atomic % to less than 10 atomic % oxygen, SiNH, SiNOH having from greater than 0 atomic % to less than 10 atomic % oxygen and multilayered stacks thereof;
forming at least one opening into said porous low k dielectric material;
forming an interconnect metal-containing structure in said at least one opening, wherein said interconnect metal-containing structure has a topmost surface that is coplanar with a topmost surface of said porous low k dielectric material; and
forming a diffusion barrier cap on said topmost surface of said porous low k dielectric material and said topmost surface of said interconnect metal-containing structure.

14. The method of claim 13, further comprising forming a diffusion barrier liner material within said at least one opening prior to forming said interconnect metal-containing structure.

15. The method of claim 13, wherein said interconnect metal-containing structure comprises directly depositing a conductive metal-containing material on exposed surfaces of said porous low k dielectric material in said at least one opening.

16. The method of claim 13, wherein said providing said porous low k dielectric material comprises depositing a film of said porous low k dielectric material by plasma enhanced chemical vapor deposition using a carbosilane precursor and a nitrogen-containing precursor, and curing said film.

17. The method of claim 16, wherein said depositing is performed in the presence of a nitrogen-oxygen source.

18. The method of claim 13, wherein said providing said porous low k dielectric material comprises depositing a film of said porous low k dielectric material by plasma enhanced chemical vapor deposition using a carbosilane precursor and a carbosilane amine based precursor, and curing said film.

19. The method of claim 18, wherein said depositing is performed in the presence of a nitrogen-oxygen source.

20. The method of claim 13, further comprising forming a material stack comprising, from bottom to top, a metal layer and a plating seed layer within said opening; and performing an anneal, wherein said anneal causes diffusion of plating seed metal from said plating seed layer through said metal layer and into a portion of said porous low k dielectric material and reaction of said diffusion plating seed metal and said porous low k dielectric material to form a $MN_xSiC_y$ layer, wherein M is Mn, Cu, Ru, Ir or any other plating seed layer, x is from 0.05 to 1, and y is from 0.1 to 1.

21. A method of forming a porous low k dielectric, said method comprising:
depositing a film of a porous low k dielectric material by plasma enhanced chemical vapor deposition using a carbosilane precursor and a nitrogen-containing precursor, wherein said porous low k dielectric material is selected from the group consisting of SiCNH, SiCNOH having from greater than 0 atomic % to less than 10 atomic % oxygen, SiNH, SiNOH having from greater than 0 atomic % to less than 10 atomic % oxygen and multilayered stacks thereof; and
curing said film.

* * * * *